(12) United States Patent
Han

(10) Patent No.: US 11,437,077 B2
(45) Date of Patent: Sep. 6, 2022

(54) SEMICONDUCTOR DEVICE INCLUDING COMMON SELECT LINE

(71) Applicant: SK hynix Inc., Icheon-si (KR)

(72) Inventor: Jae Hyun Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/162,401

(22) Filed: Jan. 29, 2021

(65) Prior Publication Data

US 2022/0051698 A1     Feb. 17, 2022

(30) Foreign Application Priority Data

Aug. 12, 2020   (KR) ............. 10-2020-0101348

(51) Int. Cl.
*G11C 5/06*     (2006.01)
*G11C 5/02*     (2006.01)
*H01L 23/538*   (2006.01)

(52) U.S. Cl.
CPC ............. *G11C 5/06* (2013.01); *G11C 5/025* (2013.01); *H01L 23/5386* (2013.01)

(58) Field of Classification Search
CPC ........ G11C 5/06; G11C 5/025; H01L 23/5386
USPC ........................................ 365/72
See application file for complete search history.

(56) References Cited

U.S. PATENT DOCUMENTS

| 10,141,374 B2 | 11/2018 | Murooka |
| 2007/0189066 A1* | 8/2007 | Dray .............. G11C 11/15 365/171 |

FOREIGN PATENT DOCUMENTS

KR        101073074 B1     7/2011

* cited by examiner

*Primary Examiner* — Huan Hoang

(57) ABSTRACT

Provided herein may be a semiconductor device. The semiconductor device may include a stack including word lines, a bit line penetrating the stack, a global bit line disposed above the stack, global word lines disposed above the stack, a common select line disposed above the stack, a first contact plug coupling the global bit line and the bit line to each other and penetrating the common select line, and second contact plugs coupling the global word lines and the word lines to each other respectively and penetrating the common select line.

20 Claims, 12 Drawing Sheets

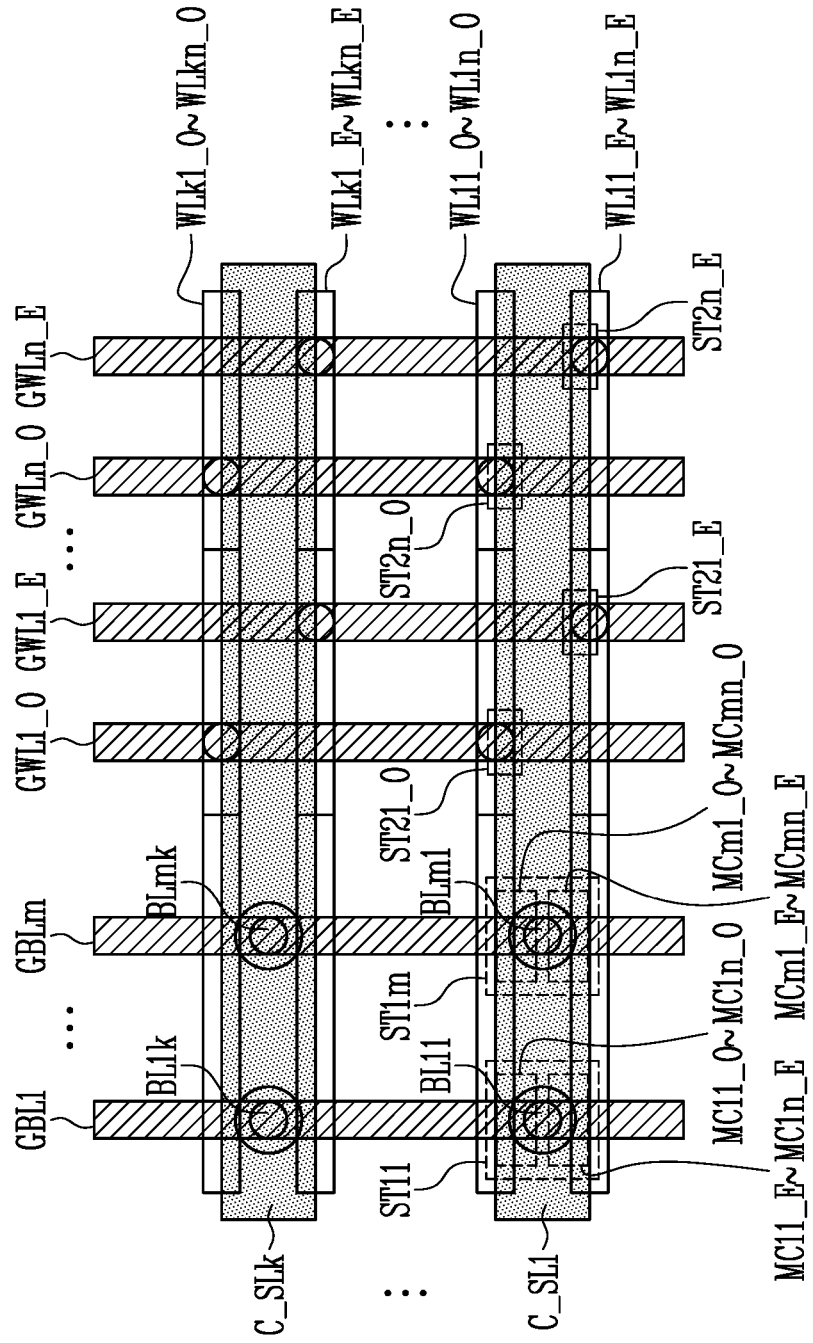

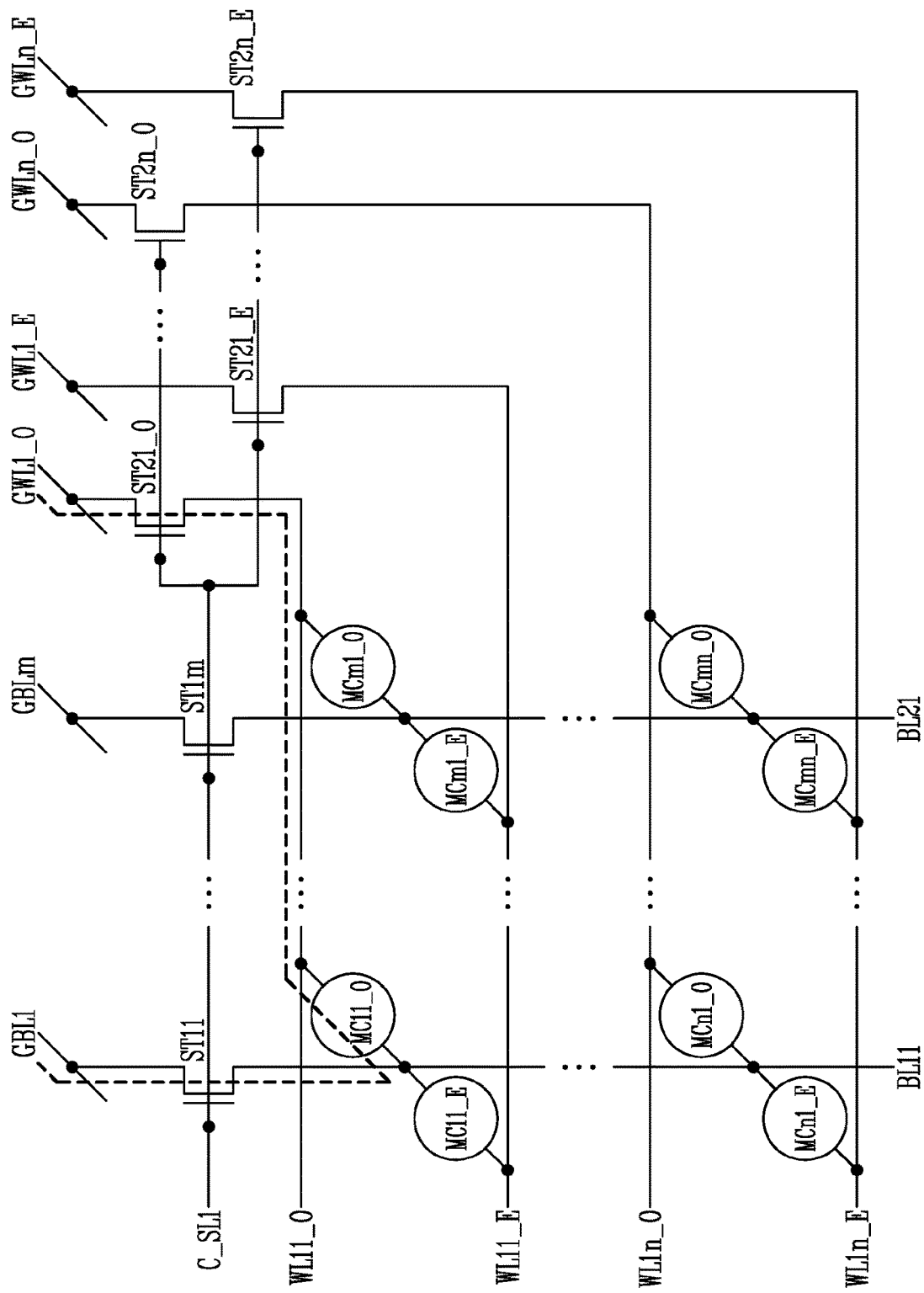

SEMICONDUCTOR DEVICE INCLUDING COMMON SELECT LINE

CROSS-REFERENCE TO RELATED APPLICATION

The present application claims priority under 35 U.S.C. § 119(a) to Korean Patent Application Number 10-2020-0101348 filed on Aug. 12, 2020 in the Korean Intellectual Property Office, the entire disclosure of which is incorporated herein by reference.

BACKGROUND

1. Field of Invention

Various embodiments of the present disclosure generally relate to an electronic device, and more particularly, to a semiconductor device including a memory.

2. Description of Related Art

To follow the trends of reduction in size, lower power consumption, higher performance, diversification, etc., of modern electronic devices, semiconductor devices for storing information are required for various electronic devices such as computers, portable communication devices, etc. Hence, studies on a semiconductor device capable of storing data by using characteristics of switching between different resistance states according to voltage or current applied are being conducted. Examples of a semiconductor device include resistive random access memory (RRAM), phase-change random access memory (PRAM), ferroelectric random access memory (FRAM), magnetic random access memory (MRAM), E-fuse, and the like.

SUMMARY

Various embodiments of the present disclosure are directed to an electronic device enabling enhancements in memory cell operation characteristics and reliability.

An embodiment of the present disclosure may provide for a semiconductor device. The semiconductor device may include a stack including word lines, a bit line penetrating the stack, a global bit line disposed above the stack, global word lines disposed above the stack, a common select line disposed above the stack, a first contact plug coupling the global bit line and the bit line to each other and penetrating the common select line, and second contact plugs coupling the global word lines and the word lines respectively to each other and penetrating the common select line.

An embodiment of the present disclosure may provide for a semiconductor device. The semiconductor device may include a bit line, a word line, a resistive memory cell coupled between the bit line and the word line, a first select transistor configured to control coupling between a global bit line and the bit line, a second select transistor configured to control coupling between a global word line and the word line, and a common select line configured to control the first select transistor and the second select transistor in common.

BRIEF DESCRIPTION OF THE DRAWINGS

FIGS. 5A and 5B are views for explaining a structure and operation method of a semiconductor device according to an embodiment of the disclosure.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Figure 1:
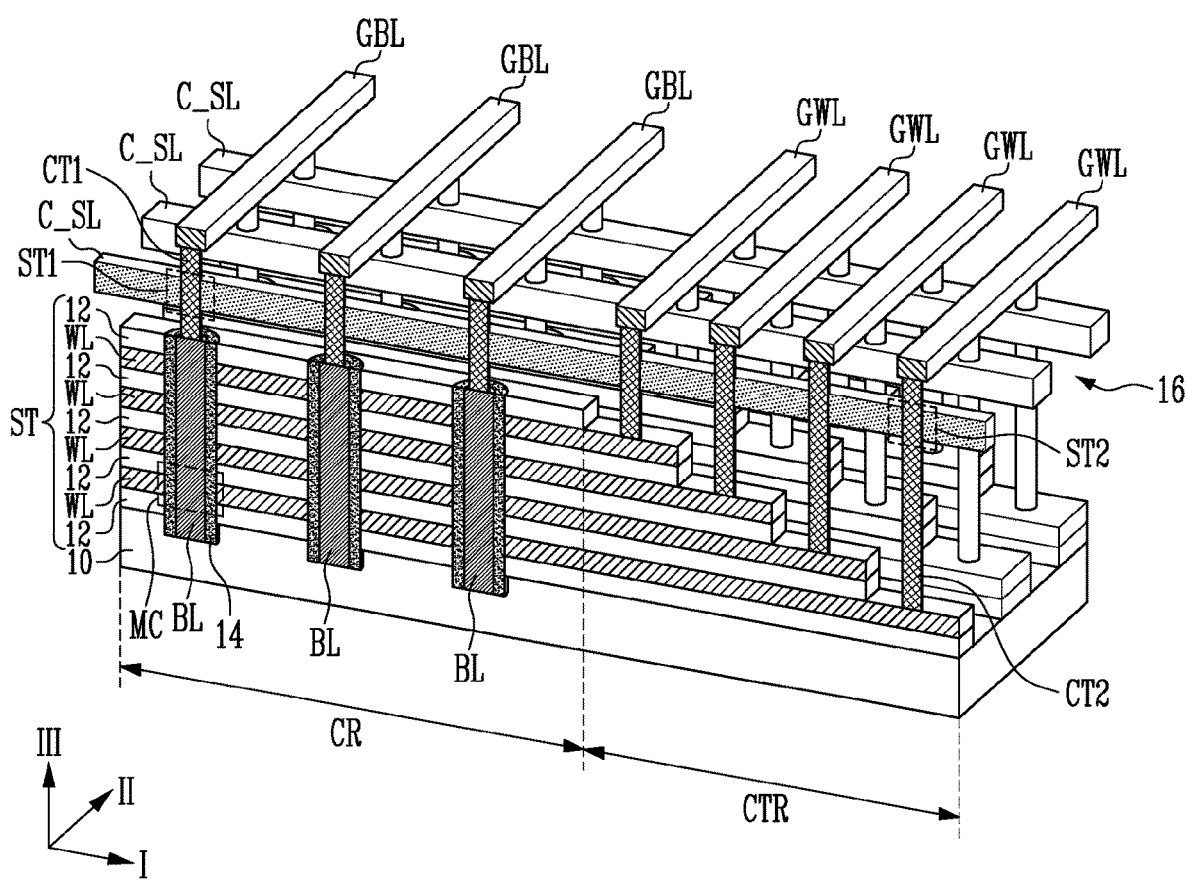
FIG. 1 is a view illustrating a structure of a semiconductor device according to an embodiment of the disclosure.

FIG. 1 is a view illustrating a structure of a semiconductor device according to an embodiment of the present disclosure.

Referring to FIG. 1, a semiconductor device may include stacks ST, bit lines BL, global bit lines GBL, global word lines GWL, and common select lines C_SL. The semiconductor device may further include a base 10, insulating spacers 14, inter-layer insulating layers 16, first contact plugs CT1 or second contact plugs CT2, or a combination of them.

The stacks ST may be disposed on the base 10. The base 10 may be a semiconductor substrate. The base 10 may include a substructure such as a peripheral circuit.

Each of the stacks ST may include word lines WL. In an embodiment of the disclosure, the stack ST may include the word lines WL and insulating layers 12, which are alternately stacked. The stack ST may extend in a first direction I. The stacks ST may be arranged side by side in a second direction II that intersects with the first direction I. The word lines WL and insulating layers 12 may extend in the first direction I.

The stack ST may include a cell region CR and a contact region CTR. The cell region CR and the contact region CTR may adjoin each other in the first direction I. The cell region CR may be a region where memory cells are stacked. The contact region CTR may be a region where pads, to which bias is applied to drive the stacked memory cells, are disposed. The contact region CTR may be patterned to expose the respective word lines WL. The contact region CTR may have a stepped form. For instance, the word lines WL may extend from the cell region CR into the contact region CTR in different lengths in the first direction I to configure the stepped form in the contact region CTR. In each word line WL, an exposed portion defined by the stepped form may be used as a pad.

Although FIG. 1 illustrates a word line WL disposed on an upper portion of each step and an insulating layer 12 disposed on a lower portion of the step, in some embodiments, it is possible that the word line WL and the insulating layer 12 are reversely disposed in each step. The insulating layer 12 may be disposed on the upper portion and the word line WL may be disposed on the lower portion in each step. Furthermore, each of the word lines WL may have a uniform thickness or have a non-uniform thickness in a third direction III. In an embodiment of the disclosure, for each word line WL, the pad may be thicker than the other portions covered by an upper insulating layer 12.

The bit lines BL may penetrate the stack ST. The bit lines BL may penetrate the stack ST in a third direction III. In an embodiment of the disclosure, the third direction III may be a direction in which the word lines WL are stacked. In other words, the third direction III may be a direction intersecting with the first direction I and the second direction II, and may be a direction protruding from a plane defined by the first direction I and the second direction II. The bit lines BL may include a conductive material such as polysilicon, metal, etc. Each bit line BL may have a planar cross-sectional shaped like a circle, an oval, a polygon, etc.

The bit lines BL may be disposed in the cell region CR. The bit lines BL may be arranged in the first direction I and the second direction II. The bit lines BL may penetrate the word lines WL. On a plane defined by the first direction I and second direction II, each word line WL may fully or partially enclose a side wall of each bit line BL. Memory cells MC may be disposed in areas or regions where the bit lines BL and the word lines WL intersect. The memory cells MC may be arranged in the first direction I and the second direction II, and be stacked in the third direction III. The memory cells MC stacked in the third direction III may share a bit line BL. The memory cells MC arranged in the first direction I may share a word line WL.

The global bit lines GBL may be provided to supply a bit line voltage to the bit lines BL. The global bit lines GBL may be disposed above the stacks ST. The global bit lines GBL may be disposed in the cell region CR, and disposed above the bit lines BL.

The global bit lines GBL may extend in the second direction II. Each of the global bit lines GBL may overlap with the bit lines BL arranged in the second direction II. The global bit lines GBL may be arranged side by side in the first direction I.

The global word lines GWL may be provided to supply a word line voltage to the word lines WL. The global word lines GWL may be disposed above the stacks ST. The global word lines GWL may be disposed in the contact region CTR, and disposed above the pads of the word lines WL.

The global word lines GWL may extend in the second direction II. The global word lines GWL may be arranged side by side in the first direction I. The global word lines GWL may extend to be parallel with the global bit lines GBL. The global word lines GWL may be disposed at substantially the same level as the global bit lines GBL, or may be disposed at a different level from the global bit lines GBL.

The common select lines C_SL may be provided to control coupling between the global bit line GBL and the bit line BL and to control coupling between the global word line GWL and the word line WL. The common select lines C_SL may be disposed above the stacks ST. The common select lines C_SL may extend in the first direction I. The common select lines C_SL may be arranged side by side in the second direction II.

The common select lines C_SL may be disposed between the stacks ST and the global bit lines GBL and between the stacks ST and the global word lines GWL. Each of the common select lines C_SL may extend from the cell region CR to the contact region CTR. In the cell region CR, the common select lines C_SL may be disposed between the bit lines BL and the global bit lines GBL. In the contact region CTR, the common select lines C_SL may be disposed between the word lines WL and the global word lines GWL.

The first contact plugs CT1 may couple the global bit lines GBL and the bit lines BL to each other. The first contact plugs CT1 may penetrate the common select lines C_SL. First select transistors ST1 may be disposed in areas or regions where the first contact plugs CT1 and the common select lines C_SL intersect. The first select transistors ST1 may be provided to control electrical coupling between the global bit lines GBL and the bit lines BL.

The second contact plugs CT2 may couple the global word lines GWL and the word lines WL to each other. The second contact plugs CT2 may penetrate the common select lines C_SL. On a plane defined by the first direction I and second direction II, each common select line C_SL may fully or partially enclose a side wall of each second contact plug CT2. Second select transistors ST2 may be disposed in areas or regions where the second contact plugs CT2 and the common select lines C_SL intersect. The second select transistors ST2 may be provided to control electrical coupling between the global word lines GWL and the word lines WL.

With the three-dimensional structure as described above, the degree of integration of a semiconductor device may be enhanced by layering the memory cells MC. Furthermore, the coupling between the global bit line GBL and the bit line BL, as well as the coupling between the global word line GWL and the word line WL, may be controlled by the common select lines C_SL. With a single common select line C_SL, both the word line WL and the bit line BL may be selected at the same time. Accordingly, each of the memory cells may be randomly accessed.

Figure 2:
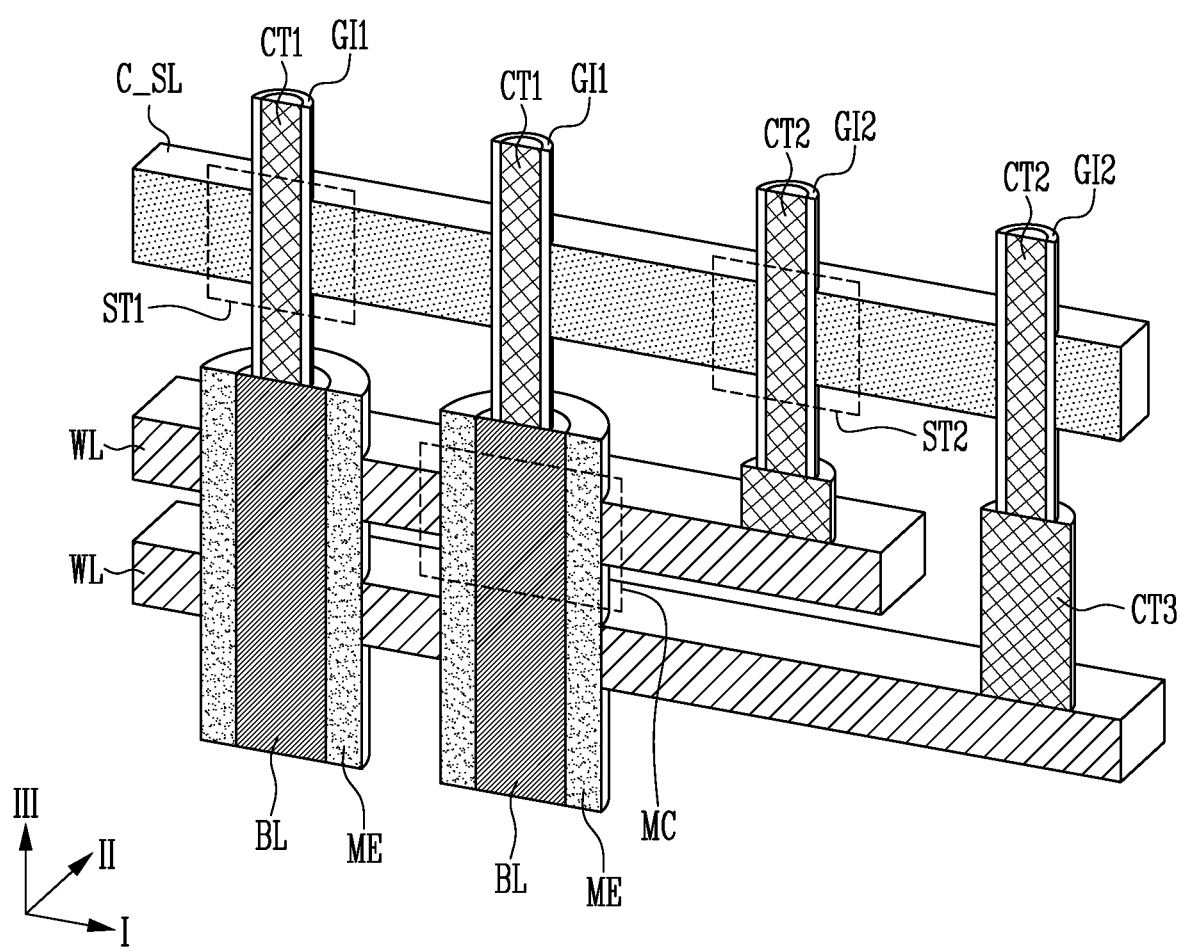
FIG. 2 is a view for explaining a structure of a semiconductor device according to an embodiment of the disclosure.

FIG. 2 is a view for explaining a structure of a semiconductor device according to an embodiment of the disclosure. Descriptions of structures or elements that are substantially the same as what are described above will not be repeated.

Referring to FIG. 2, a semiconductor device may include a memory cell MC, a first select transistor ST1, and a second select transistor ST2.

The memory cell MC may be disposed in an area or region where the bit line BL and the word line WL intersect. On a plane defined by the first direction I and second direction II, the word line WL may fully enclose a side wall of the bit line BL. The memory cell MC may include a memory layer ME interposed between the bit line BL and the word line WL. The memory layer ME is used as a data storage, and may include a variable resistive layer. The variable resistive layer may have a property of reversible transition between different resistance states depending on the applied voltage or current. The memory cell MC may be a resistive memory cell including the variable resistive layer.

In an embodiment of the disclosure, the variable resistive layer may include a resistive material. The variable resistive layer may include a transition metal oxide or a metal oxide such as a perovskite material. Accordingly, an electrical passage may be created or may dissipate in the variable resistive layer depending on the applied voltage or current, thereby enabling the memory cell MC to store data in a non-volatile manner.

In an embodiment of the disclosure, the variable resistive layer may have a magnetic tunnel junction (MTJ) structure. The variable resistive layer may include a magnetization fixed layer and a magnetization free layer, as well as a tunnel barrier layer interposed between the magnetization fixed layer and the magnetization free layer. For example, the magnetization fixed layer and the magnetization free layer may include a magnetic material, and the tunnel barrier layer may include an oxide such as magnesium (Mg), aluminum (Al), zinc (An), titanium (Ti), etc. A magnetization direction of the magnetization free layer may be changed by the spin torque of electrons under an applied current. Accordingly, the memory cell MC may store data based on a change in magnetization direction of the magnetization free layer against the magnetization direction of the magnetization fixed layer.

In an embodiment of the disclosure, the variable resistive layer may include a phase-change material, and may include a chalcogenide material. The variable resistive layer may include chalcogenide glass, chalcogenide alloy, etc. The variable resistive layer may include silicon (Si), germanium (Ge), antimony (Sb), tellurium (Te), bismuth (Bi), indium (In), tin (Sn), selenium (Se), etc., or a combination thereof. The variable resistive layer may be Ge—Sb—Te (GST). For example, the variable resistive layer may include Ge2Sb2Te5, Ge2Sb2Te7, Ge1Sb2Te4, Ge1Sb4Te7, etc. The variable resistive layer may be subject to a phase change according to a program operation. For example, a set operation may cause the variable resistive layer to have a low resistive crystalline state. A reset operation may cause the variable resistive layer to have a high resistive amorphous state. Accordingly, the memory cell MC may store data by using a difference in resistance depending on the phase of the variable resistive layer.

In an embodiment of the disclosure, the variable resistive layer may include a variable resistive material with resistance changing properties but without phase-change characteristics, and include a chalcogenide material. For example, the variable resistive layer may include Ge, Sb, Te, arsenic (As), Se, Si, In, Sb, sulfur (S), gallium (Ga), etc., or a combination thereof. The variable resistive layer may maintain its phase during a program operation. For example, the variable resistive layer may have an amorphous state that is not changed into a crystalline state during the program operation. Accordingly, with program pulses applied to the memory cell MC, a critical voltage of the memory cell MC may be changed and the memory cell MC may be programmed into at least two states. The reset operation may enable the variable resistive layer to have a high resistive amorphous state, and the memory cell MC may be programmed into a reset state of high critical voltage. The set operation may enable the variable resistive layer to have a low resistive amorphous state, and the memory cell MC may be programmed into a set state of low critical voltage.

The first select transistor ST1 may be disposed in an area or region where the first contact plug CT1 and the common select line C_SL intersect. On a plane defined by the first direction I and second direction II, the common select lines C_SL may fully enclose the side wall of the first contact plug CT1. The first select transistor ST1 may include a first channel layer, a first gate insulating layer GI1, and a first gate electrode. A portion of the first contact plug CT1, which overlaps the common select line C_SL, may be used as the first channel layer. A portion of the common select lines C_SL, which encloses the side wall of the first contact plug CT1, may be used as the first gate electrode. The first select transistors ST1 arranged linearly in the first direction I may share the common select line C_SL.

The first contact plugs CT1 may be coupled to the respective bit lines BL. Accordingly, when the first select transistor ST1 is turned on, a bit line voltage of the global bit line GBL may be applied to the bit line BL through the first contact plug CT1.

The second select transistor ST2 may be disposed in an area or region where the second contact plug CT2 and the common select line C_SL intersect. The second select transistor ST2 may include a second channel layer, a second gate insulating layer GI2, and a second gate electrode. A portion of the second contact plug CT2, which overlaps the common select line C_SL, may be used as the second channel layer. A portion of the common select lines C_SL, which encloses the side wall of the second contact plug CT2, may be used as the second gate electrode. The second select transistors ST2 arranged linearly in the first direction I may share common select lines C_SL.

The second contact plugs CT2 may be coupled to the respective word lines WL. Accordingly, when the second select transistor ST2 is turned on, a word line voltage of the global word line GWL may be applied to the word line WL through the second contact plug CT2.

The second contact plugs CT2 may be coupled to the word lines WL directly or via the third contact plugs CT3. The third contact plugs CT3 may have the same height or may have different heights. In an embodiment of the disclosure, top planes of the third contact plugs CT3 may be positioned at substantially the same level. As a result, the second contact plugs CT2 may have substantially the same height. The top planes of the third contact plugs CT3 may be positioned at substantially the same level as the top planes of the bit lines BL.

Figure 3A:
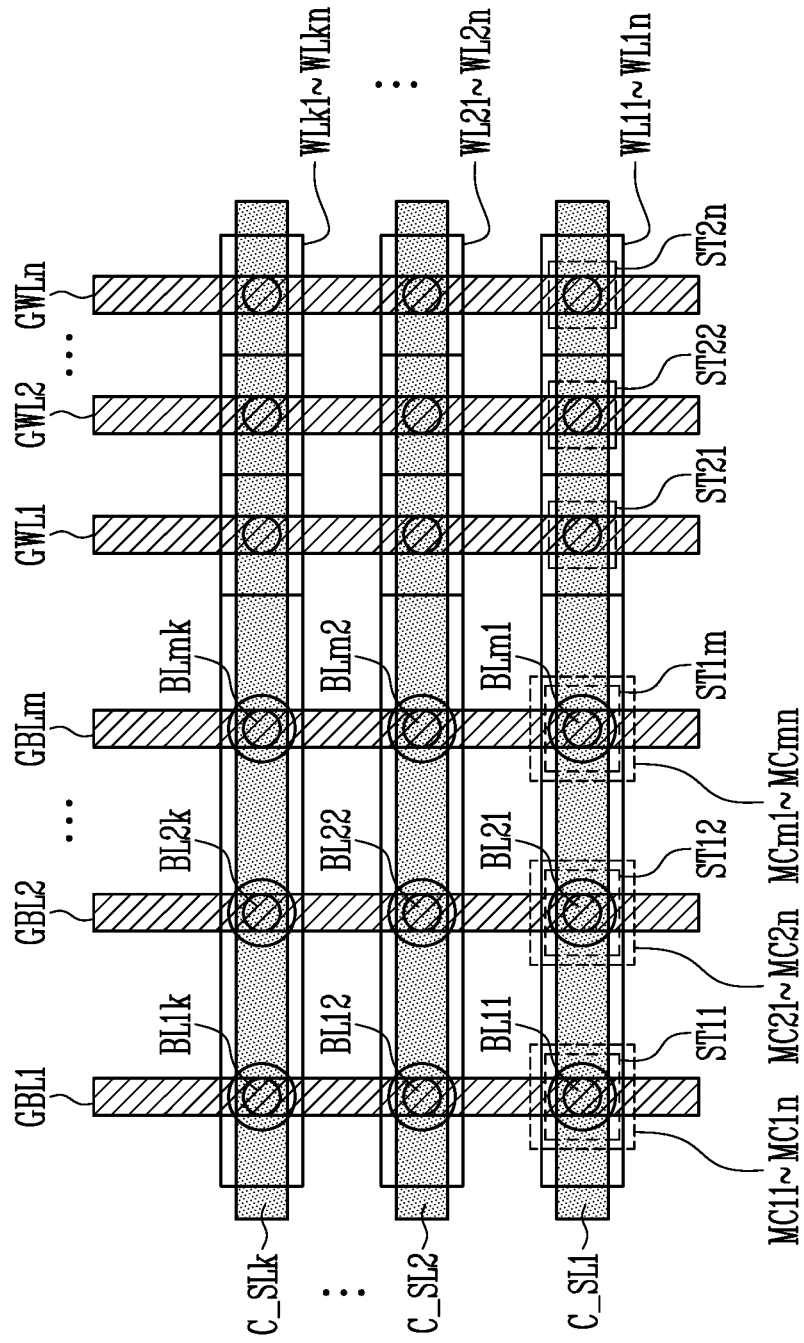
FIGS. 3A and 3B are views for explaining a structure and operation method of a semiconductor device according to an embodiment of the disclosure.
Figure 3B:
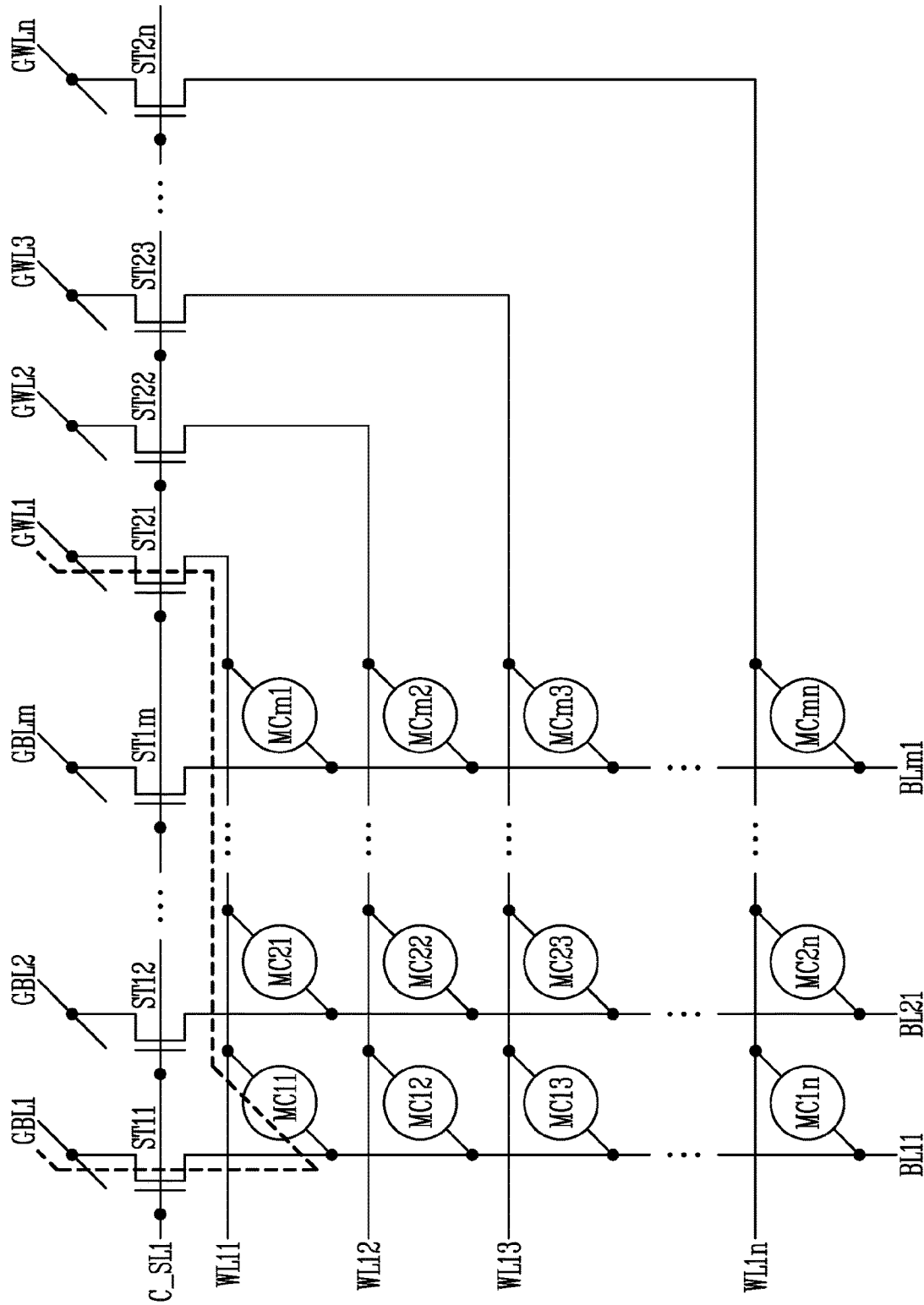

FIGS. 3A and 3B are views for explaining a structure and operation method of a semiconductor device according to an embodiment of the disclosure. Descriptions of structures or elements that are substantially the same as what are described above will not be repeated.

Referring to FIGS. 3A and 3B, a semiconductor device may include first to m-th bit lines BL11 to BLmk, first to k-th word lines WL11 to WLkn, memory cells MC11 to MCmn, first select transistors ST11 to ST1m, and second select transistors ST21 to ST2n. Furthermore, the semiconductor device may further include first to k-th common select lines C_SL1 to C_SLk, first to m-th global bit lines GBL1 to GBLm, and first to n-th global word lines GWL1 to GWLn. Here, m and n may be integers equal to or greater than 2, and k may be an integer equal to or greater than 1.

The first select transistors ST11 to ST1m control coupling between the first bit lines BL11 to BLm1 and the first to m-th global bit lines GBL1 to GBLm. In an embodiment of the disclosure, when the first select transistor ST11 is turned on, the first bit line BL11 and the first global bit line GBL1 are coupled.

The second select transistors ST21 to ST2n control coupling between the first word lines WL11 to WL1n and the first to n-th global word lines GWL1 to GWLn. In an embodiment of the disclosure, when the second select transistor ST21 is turned on, the first word line WL11 and the first global word line GWL1 are coupled.

Gate electrodes of the first select transistors ST11 to ST1m and gate electrodes of the second select transistors ST21 to ST2n may be coupled to the first common select line C_SL1. In other words, the first common select line C_SL1 may control the first select transistors ST11 to ST1m and the second select transistors ST21 to ST2n in common.

With this structure, a desired memory cell may be selected from among the memory cells MC11 to MCmn by using the common select lines C_SL1 to C_SLk. For example, with the single common select line C_SL1, both the first word lines WL11 to WL1n and the first bit line BL11 may be selected at the same time. Accordingly, each of the memory cells MC11 to MCmn may be randomly accessed.

An embodiment of selecting the first memory cell MC11 will now be described. The first global bit line GBL1 is selected from among the global bit lines GBL1 to GBLm, and the first global word line GWL1 is selected from among the global word lines GWL1 to GWLn. Furthermore, the first common select line C_SL1 is selected from among the common select lines C_SL1 to C_SLk.

A select voltage may be applied to the selected first common select line C_SL1 while a non-select voltage may be applied to the non-selected second to k-th common select lines C_SL2 to C_SLk. The select voltage may be a voltage sufficient to turn on the first select transistors ST11 to ST1m and the second select transistors ST21 to ST2n, which may be for example a power voltage. The non-select voltage may be a voltage that does not turn on, or that turns off, the first select transistors ST11 to ST1m and the second select transistors ST21 to ST2n, such as for example a ground voltage.

When the first global bit line GBL1 is selected, a bit line voltage may be applied to the first bit lines BL11 to BL1k. Because the first common select line C_SL1 is selected, only the first select transistor ST11 coupled to the first common select line C_SL1 is turned on. Accordingly, only the first bit line BL11 of the first bit lines BL11 to BL1k is coupled to the first global bit line GBL1, and the bit line voltage may be applied only to the first bit line BL11.

When the first global word line GWL1 is selected, a word line voltage may be applied to the first word lines WL11 to WLk1. Because the first common select line C_SL1 is selected, only the second select transistor ST21 coupled to the first common select line C_SL1 is turned on. Accordingly, only the first word line WL11 of the first word lines WL11 to WLk1 is coupled to the first global word line GWL1, and the word line voltage may be applied only to the first word line WL11.

According to the aforementioned structure and operation method, a desired memory cell may be selected from among the memory cells MC11 to MCmn by using the common select lines C_SL1 to C_SLk. Each of the memory cells MC11 to MCmn may be randomly accessed. Hence, a program operation, an erase operation, or a read operation may be performed on the selected memory cell. In an embodiment of the disclosure, a set operation, a reset operation, or a read operation may be performed on the selected memory cell.

Figure 4:
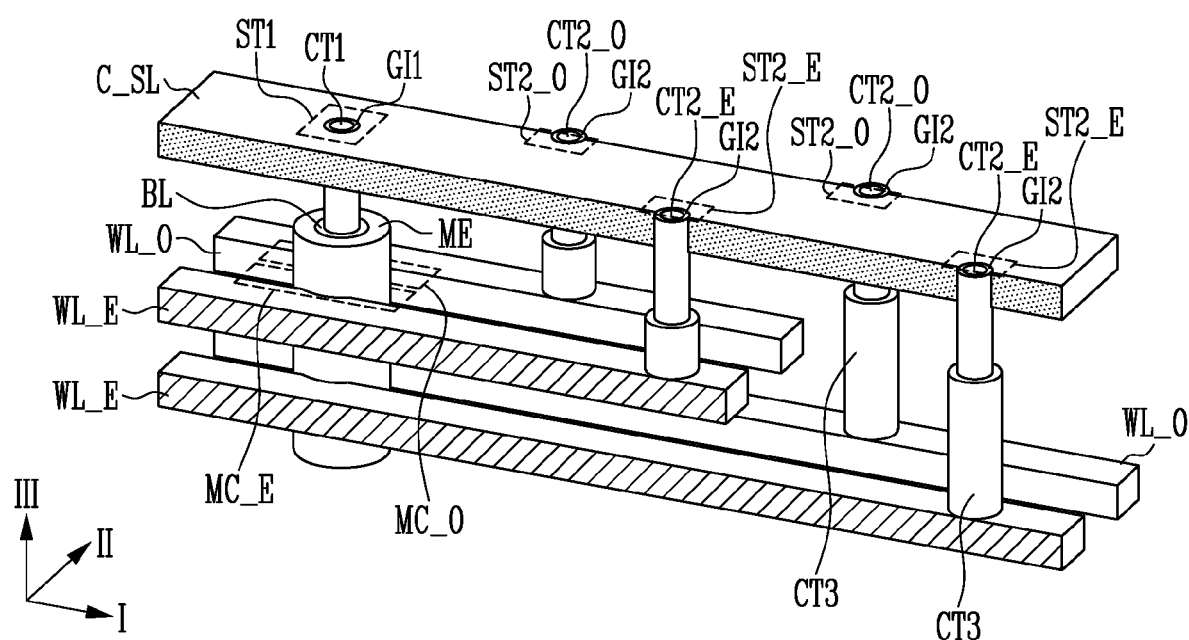
FIG. 4 is a view for explaining a structure of a semiconductor device according to an embodiment of the disclosure.

FIG. 4 is a view for explaining a structure of a semiconductor device according to an embodiment of the disclosure. Descriptions of structures or elements that are substantially the same as what are described above will not be repeated.

Referring to FIG. 4, a semiconductor device may include odd word lines WL_O and even word lines WL_E. The odd word lines WL_O may be stacked in the third direction III, and the even word lines WL_E may be stacked in the third direction III. The odd word lines WL_O and the even word lines WL_E may be disposed side by side in the second direction II.

A bit line BL may be disposed between a pair of an odd word line WL_O and an even word line WL_E, which are positioned at the same level. The pair of the odd word line WL_O and the even word line WL_E may each be formed to enclose a portion of the side wall of the bit line BL. The odd memory cell MC_O may be disposed in an area or region where the bit line BL and the odd word line WL_O intersect. The even memory cell MC_O may be disposed in an area or region where the bit line BL and the even word line WL_E intersect. A pair of the odd memory cell MC_O and the even memory cell MC_E may share the bit line BL.

The memory layer ME may be formed to enclose a side wall of the bit line BL. The pair of the odd memory cell MC_O and the even memory cell MC_E, which share the bit line BL, may share the memory layer ME. The memory layer ME may include a variable resistive layer.

The first select transistor ST1 may be disposed in an area where the first contact plug CT1 and the common select line C_SL intersect. On a plane defined by the first direction I and second direction II, the common select lines C_SL may fully enclose a side wall of the first contact plug CT1. The first select transistor ST1 may include a first channel layer, a first gate insulating layer GI1, and a first gate electrode. On a plane defined by the first direction I and second direction II, the first gate electrode may fully enclose a side wall of the first channel layer.

The first contact plugs CT1 may be coupled to the respective bit lines BL. Accordingly, when the first select transistor ST1 is turned on, the bit line voltage of the global bit line GBL may be applied to the bit line BL through the first contact plug CT1.

A second odd select transistor ST2_O may be disposed in an area or region where a second odd contact plug CT2_O and the common select line C_SL intersect. On a plane defined by the first direction I and second direction II, the common select line C_SL may enclose a portion of a side wall of the second odd contact plug CT2_O. The second odd select transistor ST2_O may include a second channel layer, a second gate insulating layer GI2, and a second gate electrode. On a plane defined by the first direction I and second direction II, the second gate electrode may enclose a portion of a side wall of the second channel layer.

A second even select transistor ST2_E may be disposed in an area or region where a second even contact plug CT2_E and the common select line C_SL intersect. On a plane defined by the first direction I and second direction II, the common select line C_SL may enclose a portion of a side wall of the second even contact plug CT2_E. The second even select transistor ST2_E may include a second channel layer, a second gate insulating layer GI2, and a second gate electrode. On a plane defined by the first direction I and second direction II, the second gate electrode may enclose a portion of a side wall of the second channel layer.

A pair of a second odd select transistor ST2_O and a second even select transistor ST2_E may be coupled to the same common select line C_SL. The second odd select transistors ST2_O arranged linearly in the first direction I and the second even select transistors ST2_E arranged linearly in the first direction I may share the common select lines C_SL.

The second odd contact plugs CT2_O may be coupled to the respective odd word lines WL_O. Accordingly, when the second odd select transistor ST2_O is turned on, a word line voltage of an odd global word line may be applied to the odd word line WL_O through the second odd contact plug CT2_O.

The second even contact plugs CT2_E may be coupled to the respective even word lines WL_E. Accordingly, when the second even select transistor ST2_E is turned on, a word line voltage of an even global word line may be applied to the even word line WL_E through the second even contact plug CT2_E.

The second odd contact plugs CT2_O may be coupled to the odd word lines WL_O directly or via the third contact plugs CT3. Similarly, the second even contact plugs CT2_E may be coupled to the even word lines WL_E directly or via the third contact plugs CT3.

FIGS. 5A and 5B are views for explaining a structure and operation method of a semiconductor device according to an embodiment of the disclosure.

Referring to FIGS. 5A and 5B, a semiconductor device may include first to m-th bit lines BL11 to BLmk, first to k-th odd word lines WL11_O to WLkn_O, first to k-th even word lines WL11_E to WLkn_E, odd memory cells MC11_O to MCmn_O, even memory cells MC11_E to MCmn_E, first select transistors ST11 to ST1$m$, second odd select transistors ST21_O to ST2$n$_O, and second even select transistors ST21_E to ST2$n$_E. Furthermore, the semiconductor device may further include first to k-th common select lines C_SL1 to C_SLk, first to m-th global bit lines GBL1 to GBLm, first to n-th odd global word lines GWL1_O to GWLn_O, and first to n-th even global word lines GWL1_E to GWLn_E. Here, m and n may be integers equal to or greater than 2, and k may be an integer equal to or greater than 1.

The first select transistors ST11 to ST1$m$ control coupling between the first bit lines BL11 to BLm1 and the first to m-th global bit lines GBL1 to GBLm. In an embodiment of the disclosure, when the first select transistor ST11 is turned on, the first bit line BL11 and the first global bit line GBL1 are coupled.

The second odd select transistors ST21_O to ST2$n$_O control coupling between the first odd word lines WL11_O to WL1$n$_O and the first to n-th odd global word lines GWL1_O to GWLn_O. In an embodiment of the disclosure, when the second odd select transistor ST21_O is turned on, the first odd word line WL11_O and the first odd global word line GWL1_O are coupled.

The second even select transistors ST21_E to ST2$n$_E control coupling between the first even word lines WL11_E to WL1$n$_E and the first to n-th even global word lines GWL1_E to GWLn_E. In an embodiment of the disclosure, when the second even select transistor ST21_E is turned on, the first even word line WL11_E and the first even global word line GWL1_E are coupled.

Gate electrodes of the first select transistors ST11 to ST1$m$, gate electrodes of the second odd select transistors ST21_O to ST2$n$_O, and gate electrodes of the second even select transistors ST21_E to ST2$n$_E may be coupled to the first common select line C_SL1. In other words, the first common select line C_SL1 may control the first select transistors ST11 to ST1$m$, the second odd select transistors ST21_O to ST2$n$_O, and the second even select transistors ST21_E to ST2$n$_E in common.

With this structure, a desired memory cell may be selected from among the odd memory cells MC11_O to MCmn_O and even memory cells MC11_E to MCmn_E by using the common select lines C_SL1 to C_SLk. With the single common select line C_SL1, both the first even word line WL11_E to WL1$n$_E and the first bit line BL11 may be selected at the same time, or both the first odd word line WL11_O to WL1$n$_O and the first bit line BL11 may be selected at the same time. Accordingly, each of the even memory cells MC11_E to MCmn_E and odd memory cells MC11_O to MCmn_O may be randomly accessed.

An embodiment of selecting the first odd memory cell MC11_O will now be described. The first global bit line GBL1 is selected from among the global bit lines GBL1 to GBLm, and the first odd global word line GWL1_O is selected from among the global word lines GWL1_O to GWLn_O and GWL1_E to GWLn_E. Furthermore, the first common select line C_SL1 is selected from among the common select lines C_SL1 to C_SLk. A select voltage may be applied to the selected first common select line C_SL1 while a non-select voltage may be applied to the non-selected second to k-th common select lines C_SL2 to C_SLk.

When the first global bit line GBL1 is selected, a bit line voltage may be applied to the first bit lines BL11 to BL1$k$. Because the first common select line C_SL1 is selected, only the first select transistors ST11 coupled to the first common select line C_SL1 are turned on. Accordingly, only the first bit line BL11 of the first bit lines BL11 to BL1$k$ is coupled to the first global bit line GBL1, and the bit line voltage may be applied only to the first bit line BL11.

When the first odd global word line GWL1_O is selected, a word line voltage may be applied to the first odd word lines WL11_O to WLk1_O. Because the first common select line C_SL1 is selected, only the second odd select transistors ST21_O coupled to the first common select line C_SL1 are turned on. Accordingly, only the first odd word line WL11_O of the first odd word lines WL11_O to WLk1_O is coupled to the first odd global word line GWL1_O, and the word line voltage may be applied only to the first odd word line WL11_O.

With the aforementioned structure and operation method, a desired memory cell may be selected from among the odd memory cells MC11_O to MCmn_O and even memory cells MC11_E to MCmn_E by using the common select lines C_SL1 to C_SLk. Accordingly, each of the odd memory cells MC11_O to MCmn_O and even memory cells MC11_E to MCmn_E may be randomly accessed. Hence, a program operation, an erase operation, or a read operation may be performed on the selected memory cell. In an embodiment of the disclosure, a set operation, a reset operation, or a read operation may be performed on the selected memory cell.

Figure 6:
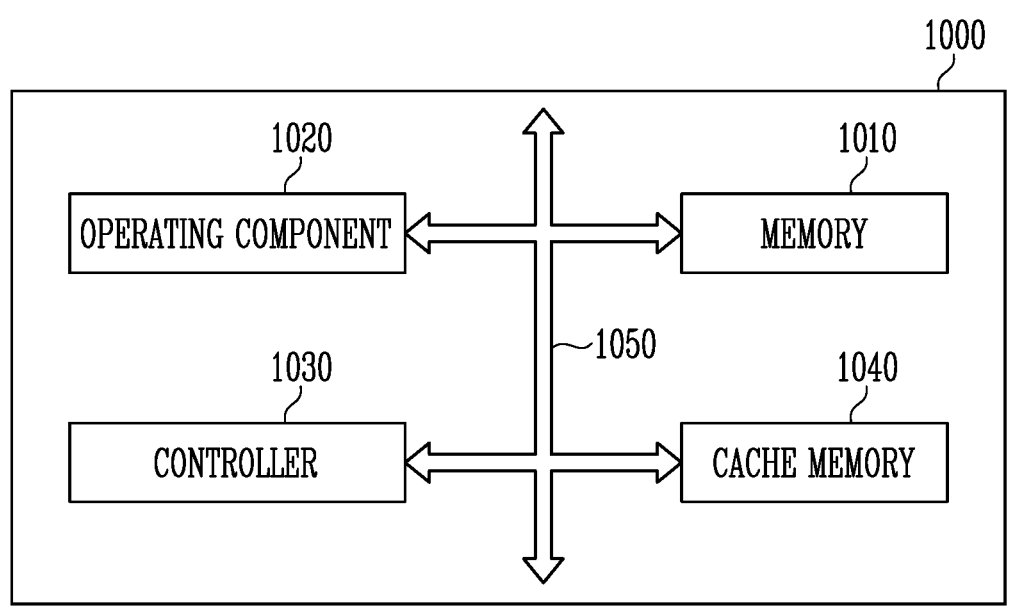
FIG. 6 is a configuration diagram of a microprocessor for implementing a memory device according to an embodiment of the disclosure.

FIG. 6 is a configuration diagram of a microprocessor for implementing a memory device according to an embodiment of the disclosure.

Referring to FIG. 6, a microprocessor 1000 may control and coordinate a series of procedures of receiving data from various external devices, processing the data, and then sending the result to the external device, and may include a memory 1010, an operating component 1020, a controller 1030, etc. The microprocessor 1000 may be any of various data processing devices, such as a central processing unit (CPU), a graphic processing unit (GPU), a digital signal processor (DSP), an application processor (AP), etc.

The memory 1010 may include a processor register, a register, etc., which may be a part in the microprocessor 1000 for storing data, including a data register, an address register, a floating point register, and other various registers. The memory 1010 may serve to temporarily store data to be subject to an operation performed by the operating component 1020 or data resulting from the operation, and an address where the data is stored.

The memory 1010 may include one or more of the embodiments of the electronic device as described above. For example, the memory 1010 may include a bit line, a word line, a resistive memory cell coupled between the bit line and the word line, a first select transistor for controlling coupling between a global bit line and the bit line, a second select transistor for controlling coupling between a global word line and the word line, and a common select line for controlling the first select transistor and the second select transistor in common. This may improve degree of integration and operation characteristics of the memory 1010. As a result, operation characteristics of the microprocessor 1000 may be enhanced.

The operating component 1020 may perform four fundamental mathematical operations or logical operations based on a result of decrypting a command by the controller 1030. The operating component 1020 may include one or more arithmetic and logic units (ALUs).

The controller 1030 may receive signals from the memory 1010, the operating component 1020, an external device of the microprocessor 1000, etc., extract or decrypt a command, control signal input or output of the microprocessor 1000, and execute a process represented in a program.

In an embodiment of the disclosure, the microprocessor 1000 may further include a cache memory 1040, which temporarily stores data to be input or output from or to an external device other than the memory 1010. In this case, the cache memory 1040 may exchange data with the memory 1010, the operating component 1020, and the controller 1030 through a bus interface 1050.

Figure 7:
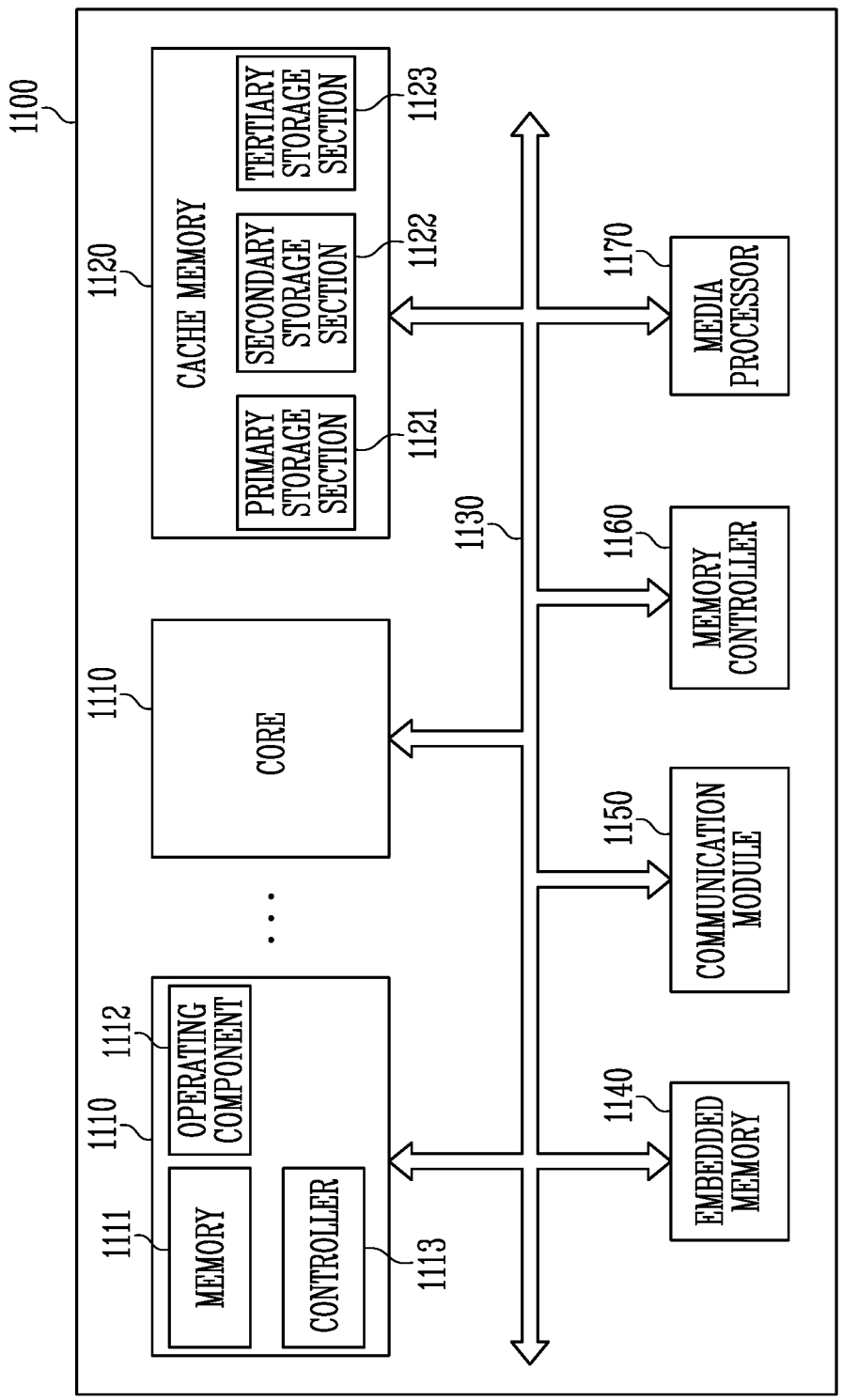
FIG. 7 is a configuration diagram of a processor for implementing a memory device according to an embodiment of the disclosure.

FIG. 7 is a configuration diagram of a microprocessor for implementing a memory device according to an embodiment of the disclosure.

Referring to FIG. 7, a processor 1100 may enable performance enhancement and multiple functions to be implemented with various capabilities in addition to the capabilities of a microprocessor. The processor 1100 controls and coordinates a series of procedures of receiving data from various external devices, processing the data, and then sending the result to the external device. The processor 1100 may include a core 1110 for serving as a microprocessor, a cache memory 1120 for serving to temporarily store data, and a bus interface 1130 for transferring data between an internal device and an external device. The processor 1100 may include various system on chips (SoC) such as a multi-core processor, a GPU, an AP, etc.

In an embodiment of the disclosure, the core 1110 may be a part for performing an arithmetic and logic operation on data input from an external device, and may include a memory 1111, an operating component 1112, and a controller 1113.

The memory 1111 may be a processor register, a register, etc., which may be a part in the processor 1100 for storing data, and may include a data register, an address register, a floating point register, and other various registers. The memory 1111 may serve to temporarily store data to be subject to an operation performed by the operating component 1112 or data resulting from the operation, and an address where the data is stored. The operating component 1112 may be a part for performing an operation in the processor 1100, and may perform four fundamental mathematical operations or logical operations based on a result of decrypting a command by the controller 1113. The operating component 1112 may include one or more arithmetic and logic units (ALUs). The controller 1113 may receive signals from the memory 1111, the operating component 1112, an external device of the processor 1100, etc., extract or decrypt a command, control signal input or output of the processor 1100, and execute a process represented in a program.

The cache memory 1120 may be a part for temporarily storing data to complement a difference in data processing rate between the core 1110 operating at high speed and an external device operating at low speed, and may include a primary storage section 1121, a secondary storage section 1122, and a tertiary storage section 1123. The cache memory 1120 may typically include primary and secondary storage sections 1121 and 1122, and may further include a tertiary storage section 1123 when high capacity is required and even more storages as needed. That is, the number of storages to be included in the memory 1120 may vary by design. In the meantime, processing rates of storing and identifying data in the primary, secondary, and tertiary storage sections 1121, 1122, and 1123 may be the same or may be different. When each storage has a different processing rate, the primary storage may have the highest rate. One or more of the primary storage section 1121, the secondary storage section 1122, and the tertiary storage section 1123 of the cache memory 1120 may include one or more of the embodiments of the electronic device as described above. For example, the cache memory 1120 may include a bit line, a word line, a resistive memory cell coupled between the bit line and the word line, a first select transistor for controlling coupling between a global bit line and the bit line, a second select transistor for controlling coupling between a global word line and the word line, and a common select line for controlling the first select transistor and the second select transistor in common. As a result, operation characteristics of the processor 1100 may be enhanced.

Although it is shown in FIG. 7 that the primary, secondary, and tertiary storage sections 1121, 1122, and 1123 are all configured in the cache memory 1120, all the primary, secondary, and tertiary storage sections 1121, 1122, and 1123 may be configured outside of the core 1110 to complement a difference in processing rate between the core 1110 and an external device. In some embodiments, the primary storage section 1121 of the cache memory 1120 may be disposed in the core 1110, and the secondary and tertiary storage sections 1122 and 1123 may be configured outside of the core 1110 to further reinforce the complementary performance of storages with different processing rates. In other embodiments, the primary and secondary storage sections 1121 and 1122 may be disposed in the core 1110, and the tertiary storage section 1123 may be disposed outside the core 1110, for similar reasons.

The bus interface 1130 is a part that couples the core 1110, the cache memory 1120, and an external device to each other so as to efficiently transfer data.

In an embodiment of the disclosure, the processor 1100 may include multiple cores 1110, which may share the cache memory 1120. The multiple cores 1110 and the cache memory 1120 may be coupled directly (not illustrated) or via the bus interface 1130. All of the multiple cores 1110 may be configured in the same or substantially same manner as for the above described core. When the processor 1100 includes the multiple cores 1110, the primary storage section 1121 of the cache memory 1120 may be configured in each of the multiple cores 1110, and the secondary and tertiary storage sections 1122 and 1123 may be configured outside the multiple cores 1110 and may be shared through the bus interface 1130. A processing rate of the primary storage section 1121 may be higher than the processing rates of the secondary and tertiary storage sections 1122 and 1123. In an embodiment of the disclosure, the primary and secondary storage sections 1121 and 1122 may be configured in each of the multiple cores 1110, and the tertiary storage section 1123 may be configured outside the multiple cores 1110 and may be shared through the bus interface 1130.

In an embodiment of the disclosure, the processor 1100 may further include an embedded memory 1140 for storing data, a communication module 1150 for transmitting or receiving data to or from an external device wiredly or wirelessly, a memory controller 1160 for driving an external memory device, a media processor 1170 for manipulating and outputting data processed by the processor 1100 or input from the external device, and other various modules and devices. In this case, the added multiple modules may exchange data with each other, the core 1110 and the cache memory 1120 through the bus interface 1130.

The embedded memory 1140 may include not only a volatile memory but also a nonvolatile memory. The volatile memory may include a dynamic random access memory (DRAM), a mobile DRAM, a static RAM (SRAM), and a memory with a similar function thereto, and the nonvolatile memory may include a read only memory (ROM), a NOR flash memory, a NAND flash memory, a phase change RAM (PRAM), a resistive RAM (RRAM), a spin transfer torque RAM (STTRAM), a magnetic RAM (MAM), and a memory with a similar function thereto.

The communication module 1150 may include a module to be coupled to a wired network, a module to be coupled to a wireless network, or both. The wired network module may include a local area network (LAN), a universal serial bus (USB), an Ethernet, a power line communication (PLC), etc., or like various devices that transmit or receive data through a transmission line. The wireless network module may include for example infrared data association (IrDA), code division multiple access (CDMA), time division multiple access (TDMA), frequency division multiple access (FDMA), wireless LAN (WLAN), Zigbee, a ubiquitous sensor network (USN), Bluetooth, radio frequency identification (RFID), long term evolution (LTE), near field communication (NFC), wireless broadband Internet (Wibro), high speed downlink packet access (HSDPA), wideband CDMA (WCDMA), ultra wideband (UWB), etc.

The memory controller 1160 may serve to process and manage data transmitted between the processor 1100 and an external storage device that operates according to a different communication standard, and may include any of various memory controllers, e.g., controllers for controlling integrated device electronics (IDE), serial advanced technology attachment (SATA), a small computer system interface (SCSI), a redundant array of independent disk (RAID), a solid state disk (SSD), external SATA (eSATA), personal computer memory card international association (PCM-CIA), a USB, a secure digital card (SD), a mini SD (mSD), a micro SD, a secure digital high capacity card (SDHC), a memory stick card, a smart media card (SM), a multi-media card (MMC), an embedded MMC (eMMC), a compact flash card (CF), etc.

The media processor 1170 may manipulate data processed by the processor 1100 or input from an external device in a video, voice, or any other format, and output the data to an external interface device. The media processor 1170 may include a GPU, a DSP, a high definition audio (HD audio), a high definition multimedia interface (HDMI) controller, etc. for example.

Figure 8:
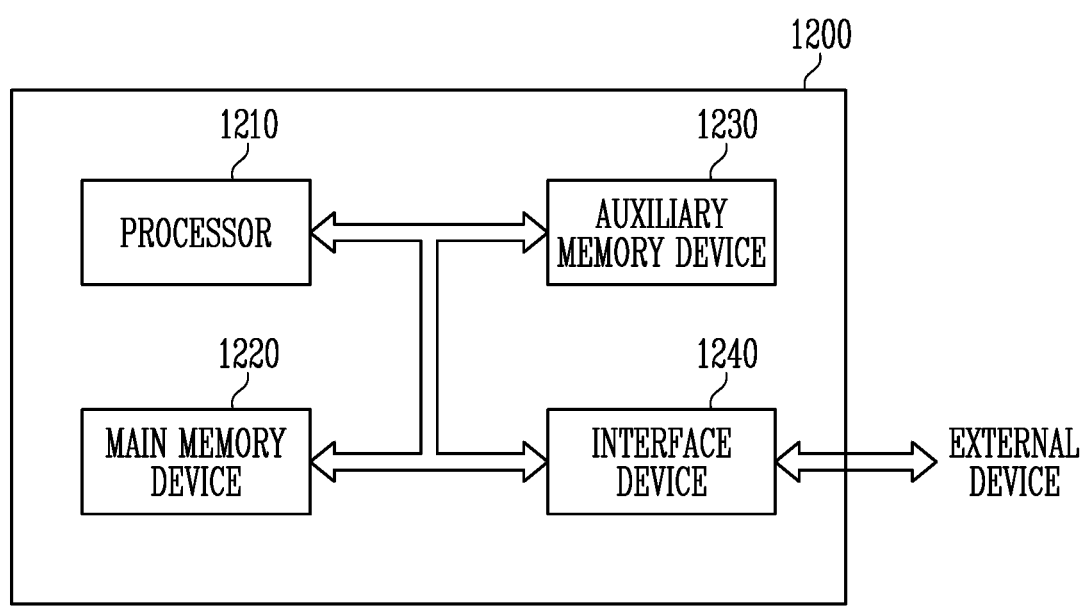
FIG. 8 is a configuration diagram of a system for implementing a memory device according to an embodiment of the disclosure.

FIG. 8 is a configuration diagram of a system for implementing a memory device according to an embodiment of the disclosure.

Referring to FIG. 8, a system 1200 is a device for processing data, which may perform inputting, processing, outputting, communication, etc., on the data to manipulate the data. The system 1200 may include a processor 1210, a main memory device 1220, an auxiliary memory device 1230, an interface device 1240, etc. In this embodiment, the system 1200 may be any of various electronic systems operating with a process, such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, telematics, an audio visual (AV) system, a smart television, etc.

The processor 1210 may control an input instruction to be interpreted and a material stored in the system 1200 to be operated and compared, and may include a microprocessor unit (MPU), a CPU, a single/multi-core processor, a GPU, an AP, a DSP, etc.

The main memory device 1220 is a memory for storing program codes or materials moved from the auxiliary memory device 1230 for execution while a program is running, and may preserve its contents even if powered off. The main memory device 1220 may include one or more of the embodiments of the electronic device as described above. For example, the main memory device 1220 may include a bit line, a word line, a resistive memory cell coupled between the bit line and the word line, a first select transistor for controlling coupling between a global bit line and the bit line, a second select transistor for controlling coupling between a global word line and the word line, and a common select line for controlling the first select transistor and the second select transistor in common. This may improve a degree of integration and operation characteristics of the main memory device 1220. As a result, operation characteristics of the system 1200 may be enhanced.

Furthermore, the main memory device 1220 may further include a volatile memory, such as an SRAM, a DRAM, etc., whose contents are all deleted when power to the main memory 1220 is turned off. In some other embodiments, the main memory device 1220 may further include a volatile memory, such as an SRAM, a DRAM, etc., whose contents are all deleted when power to the main memory 1220 is turned off, without including the electronic device according to the embodiments of the disclosure as described above.

The auxiliary memory device 1230 is referred to as a memory device for storing program codes or data. It may operate at slower speed than the main memory device 1220, but may store a lot of materials. The auxiliary memory device 1230 may include one or more of the embodiments of the electronic device as described above. For example, the auxiliary memory device 1230 may include a bit line, a word line, a resistive memory cell coupled between the bit line and the word line, a first select transistor for controlling coupling between a global bit line and the bit line, a second select transistor for controlling coupling between a global word line and the word line, and a common select line for controlling the first select transistor and the second select transistor in common. This may improve a degree of integration and operation characteristics of the auxiliary memory device 1230. As a result, operation characteristics of the system 1200 may be enhanced.

Furthermore, the auxiliary memory device 1230 may further include a data storage system 1300 (see FIG. 9), such as a magnetic tape or magnetic disk using magnetics, a laser disc using light, a magneto-optical disc using the both magnetic and optical discs, a solid state disk (SSD), a USB memory, an SD, an mSD, a micro SD, an SDHC, a memory stick card, an SM, an MMC, an eMMC, a CF, etc. In some other embodiments, the auxiliary memory device 1230 may include a data storage system 1300 (see FIG. 9), such as a magnetic tape or magnetic disk using magnetics, a laser disc using light, a magneto-optical disc using the both magnetic and optical discs, a solid state disk (SSD), a USB memory, an SD, an mSD, a micro SD, an SDHC, a memory stick card, an SM, an MMC, an eMMC, a CF, etc., without including the electronic device according to the embodiments of the disclosure as described above.

The interface device 1240 may serve to exchange commands, data, etc., between the system 1200 according to the embodiments of the disclosure and an external device, and may be a keypad, a keyboard, a mouse, a speaker, a microphone, a display, any of various human interface devices (HIDs), a communication device, etc. The communication device may include a module to be coupled to a wired network, a module to be coupled to a wireless network, or both. The wired network module may include a LAN, a USB, an Ethernet, a PLC, etc., like various devices for transmitting or receiving data through a transmission line, and the wireless network module may include IrDA, CDMA, TDMA, FDMA, wireless LAN, Zigbee, a USN, Bluetooth, RFID, LTE, NFC, Wibro, HSDPA, WCDMA, UWB, etc., and various similar devices for transmitting or receiving data without any transmission line.

Figure 9:
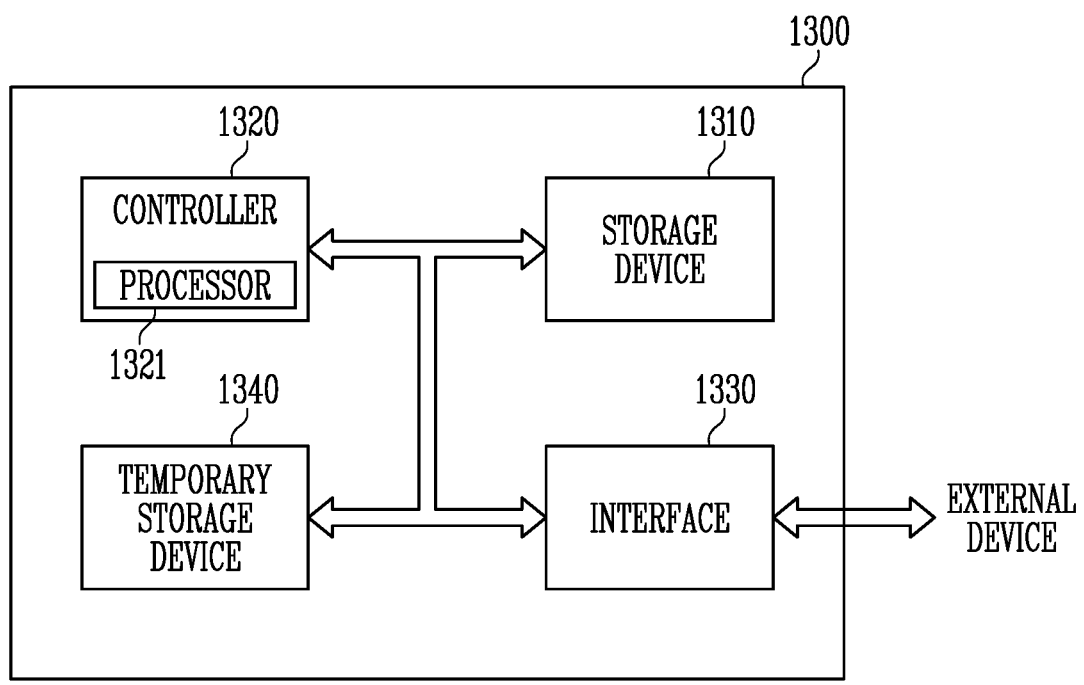
FIG. 9 is a configuration diagram of a data storage system for implementing a memory device according to an embodiment of the disclosure.

FIG. 9 is a configuration diagram of a data storage system for implementing a memory device according to an embodiment of the disclosure.

Referring to FIG. 9, a data storage system 1300 is configured to store data, and may include a storage device 1310 having a nonvolatile property, a controller 1320 that controls the data storage system 1300, an interface 1330 that is used for coupling to an external device, and a temporary storage device 1340, which temporarily stores data. The data storage system 1300 may have a disc type such as a hard disk drive (HDD), a compact disc ROM (CD-ROM), a digital versatile disc (DVD), an SSD, etc., and a card type, such as a USB memory, an SD, an mSD, a micro SD, an SDHC, a memory stick card, an SM, an MMC, an eMMC, a CF, etc.

The storage device 1310 may include a nonvolatile memory for storing data semi-permanently. The nonvolatile memory may include a ROM, a NOR flash memory, a NAND flash memory, a PRAM, a RRAM, an MRAM, etc.

The controller 1320 may control data to be exchanged between the storage device 1310 and the interface 1330. For this, the controller 1320 may include a processor 1321 for performing an operation to process instructions input from outside the data storage system 1300 through the interface 1330.

The interface 1330 serves to exchange commands and data between the data storage system 1300 and an external device. When the data storage system 1300 is a card, the interface 1330 may be compatible with interfaces used by a device such as a USB memory, an SD, an mSD, a micro SD, an SDHC, a memory stick card, an SM, an MMC, an eMMC, a CF, or a similar device. If the data storage system 1300 has a disc type, then the interface 1330 may be compatible with an interface such as IDE, SATA, SCSI, eSATA, PCMCIA, USB, or a similar interface. The interface 1330 may be compatible with one or more interfaces in different types.

To allow diversification and for higher performance of interfaces, controllers, and systems, the temporary storage device 1340 may temporarily store data for efficient data transfer between the interface 1330 and the storage device 1310. The temporary storage device 1340 may include one or more of the embodiments of the electronic device as described above. For example, the temporary storage device 1340 may include a bit line, a word line, a resistive memory cell coupled between the bit line and the word line, a first select transistor configured to control coupling between a global bit line and the bit line, a second select transistor configured to control coupling between a global word line and the word line, and a common select line configured to control the first select transistor and the second select transistor in common. This may improve a degree of integration and operation characteristics of the temporary storage device 1340. As a result, operation characteristics of the data storage system 1300 may be enhanced.

Figure 10:
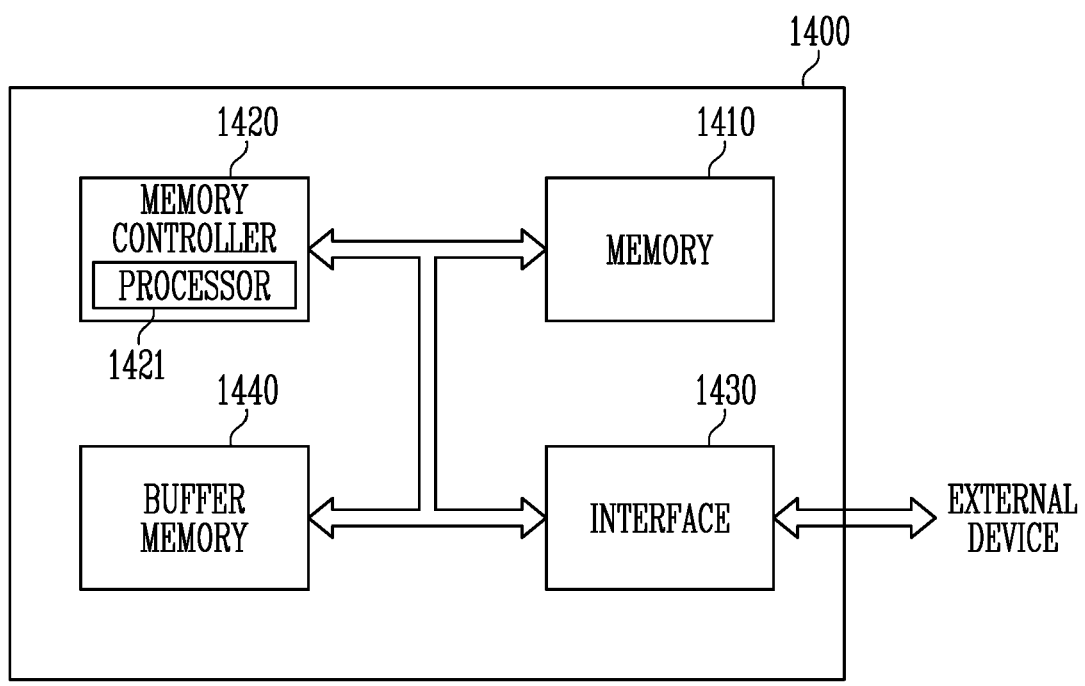
FIG. 10 is a configuration diagram of a memory system for implementing a memory device according to an embodiment of the disclosure.

FIG. 10 is a configuration diagram of a memory system for implementing a memory device according to an embodiment of the disclosure.

Referring to FIG. 10, a memory system 1400 is configured to store data, and may include a memory 1410 having a nonvolatile property, a memory controller 1420 that controls the memory system 1400, an interface 1430 that is used for coupling to an external device, etc. The memory system 1400 may have a card type, such as an SSD, a USB memory, an SD, an mSD, a micro SD, an SDHC, a memory stick card, an SM, an MMC, an eMMC, a CF, etc.

The memory 1410 for storing data may include one or more of the embodiments of the electronic device as described above. For example, the memory 1410 may include a bit line, a word line, a resistive memory cell coupled between the bit line and the word line, a first select transistor for controlling coupling between a global bit line and the bit line, a second select transistor for controlling coupling between a global word line and the word line, and a common select line for controlling the first select transistor and the second select transistor in common. This may improve a degree of integration and operation characteristics of the memory 1410. As a result, operation characteristics of the memory system 1400 may be enhanced.

Also, the memory in an embodiment of the disclosure may include a ROM, a NOR flash memory, a NAND flash memory, a PRAM, a RRAM, an MRAM, etc., which have a nonvolatile property.

The memory controller 1420 may control data to be exchanged between the memory 1410 and the interface 1430. For this, the memory controller 1420 may include a processor 1421 for performing an operation to process instructions input from outside the memory system 1400 through the interface 1430.

The interface 1430 may serve to exchange commands and data between the memory system 1400 and an external device, and may be compatible with an interface used by a device such as a USB memory, an SD, an mSD, a micro SD, an SDHC, a memory stick card, an SM, an MMC, an eMMC, a CF, or a similar device. The interface 1430 may be compatible with one or more different types of interfaces.

To follow the trends of diversification and higher performance of interfaces with external devices, memory controllers and memory systems, the memory system 1400 in the embodiment of the disclosure may further include a buffer memory 1440 for efficient transfer of input/output data between the interface 1430 and the memory 1410. The buffer memory 1440 for temporarily storing data may include one or more of the embodiments of the electronic device as described above. For example, the buffer memory 1440 may include a bit line, a word line, a resistive memory cell coupled between the bit line and the word line, a first select transistor for controlling coupling between a global bit line and the bit line, a second select transistor for controlling coupling between a global word line and the word line, and a common select line for controlling the first select transistor and the second select transistor in common. As a result, operation characteristics of the memory system 1400 may be enhanced.

Also, the buffer memory 1440 in some embodiments of the disclosure may further include a volatile memory such as an SRAM and a DRAM, and a nonvolatile memory such as a ROM, a NOR flash memory, a NAND flash memory, a PRAM, a RRAM, an STTRAM, an MRAM, etc. In other embodiments, however, the buffer memory 1440 may include a volatile memory such as an SRAM and a DRAM, and a nonvolatile memory such as a ROM, a NOR flash memory, a NAND flash memory, a PRAM, a RRAM, an STTRAM, an MRAM, etc., without including the electronic device according to the above described embodiment.

According to embodiments of the disclosure, operation characteristics and reliability of a semiconductor device may be enhanced.

Examples of embodiments have been disclosed herein, and although specific terms are employed, they are used and are to be interpreted in a generic and descriptive sense only and not for the purpose of limitation. In some instances, as would be apparent to one of ordinary skill in the art as of the filing of the present application, features, characteristics, and/or elements described in coupling with a particular embodiment may be used singly or in combination with features, characteristics, and/or elements described in coupling with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
   a stack including word lines;
   a bit line penetrating the stack;
   a global bit line disposed above the stack;
   global word lines disposed above the stack;
   a common select line disposed above the stack;
   a first contact plug coupling the global bit line and the bit line to each other and penetrating the common select line; and
   second contact plugs coupling the global word lines and the word lines respectively to each other and penetrating the common select line.

2. The semiconductor device according to claim 1, wherein the common select line controls coupling between the global bit line and the bit line and coupling between the global word lines and the word lines in common.

3. The semiconductor device according to claim 1, further comprising:
   a first gate insulating layer interposed between the first contact plug and the common select line; and
   second gate insulating layers interposed between the second contact plugs and the common select line.

4. The semiconductor device according to claim 1, further comprising:
   a first select transistor disposed in an area where the first contact plug and the common select line intersect; and
   second select transistors disposed in areas where the second contact plugs and the common select line intersect.

5. The semiconductor device according to claim 1, wherein the common select line fully encloses a side wall of the first contact plug on a cross-sectional plane defined by a first direction and a second direction.

6. The semiconductor device according to claim 1, wherein the common select line partially encloses a side wall of the first contact plug on a cross-sectional plane defined by a first direction and a second direction.

7. The semiconductor device according to claim 1, wherein the common select line is disposed between the global bit line and the bit line and is disposed between the global word lines and the word lines.

8. The semiconductor device according to claim 1, wherein the word lines comprise odd word lines and even word lines, and the bit line is disposed between a pair of an odd word line and an even word line.

9. The semiconductor device according to claim 1, further comprising:
   a first select transistor disposed in an area where the first contact plug and the common select line intersect and turned on when a select voltage is applied to the common select line.

10. The semiconductor device according to claim 9, further comprising:
    second select transistors disposed in areas where the second contact plugs and the common select line intersect and turned on when the select voltage is applied to the common select line.

11. The semiconductor device according to claim 10, wherein the first select transistor and the second select transistors are turned off when a non-select voltage is applied to the common select line.

12. The semiconductor device according to claim 9, wherein:
    the word lines comprise even word lines and odd word lines and the global word lines comprise even global word lines and odd global word lines, and
    the semiconductor device further comprises second even select transistors disposed in areas where second contact plugs coupled to the even global word lines and the common select line intersect, and second odd select transistors disposed in areas where second contact plugs coupled to the odd global word lines and the common select line intersect.

13. The semiconductor device according to claim 12, wherein the first select transistor, the second even select transistors, and the second odd select transistors are turned on when a select voltage is applied to the common select line.

14. The semiconductor device according to claim 1, wherein the word line extends in a first direction, and the global bit line and the global word lines extend in a second direction, which intersects the first direction.

15. The semiconductor device according to claim 14, wherein the common select line extends in the first direction.

16. The semiconductor device according to claim 1, wherein the word lines are stacked in a stepped form.

17. A semiconductor device comprising:
    a stack including word lines;
    a bit line penetrating the stack;
    a common select line disposed above the stack;
    a resistive memory cell coupled between the bit line and the word lines;
    a first select transistor configured to control coupling between a global bit line and the bit line; and
    a second select transistor configured to control coupling between a global word line and the word lines,
    wherein the common select line is configured to control the first select transistor and the second select transistor in common.

18. The semiconductor device according to claim 17, wherein the first select transistor and the second select transistor are turned on when a select voltage is applied to the common select line.

19. The semiconductor device according to claim 17, wherein:
- the word lines comprise an even word line and an odd word line,
- the global word line comprises an even global word line and an odd global word line, and
- the second select transistor comprises a second even select transistor coupled between the even word line and the even global word line and a second odd select transistor coupled between the odd word line and the odd global word line.

20. A semiconductor device comprising:
- a bit line;
- a word line;
- a resistive memory cell coupled between the bit line and the word line;
- a first select transistor configured to control coupling between a global bit line and the bit line;
- a second select transistor configured to control coupling between a global word line and the word line; and
- a common select line configured to control the first select transistor and the second select transistor in common, wherein:
- the word line comprises an even word line and an odd word line,
- the global word line comprises an even global word line and an odd global word line, and
- the second select transistor comprises a second even select transistor coupled between the even word line and the even global word line and a second odd select transistor coupled between the odd word line and the odd global word line, and
- wherein the first select transistor, the second even select transistor, and the second odd select transistor are turned on when a select voltage is applied to the common select line.

\* \* \* \* \*